(12) United States Patent
Liu et al.

(10) Patent No.: US 10,038,042 B2
(45) Date of Patent: Jul. 31, 2018

(54) OLED COLOR DISPLAY DEVICE

(71) Applicant: Shenzhen China Star Optoelectronics Technology Co., Ltd., Shenchen (CN)

(72) Inventors: Yawei Liu, Shenzhen (CN); Yifan Wang, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 14/655,720

(22) PCT Filed: Apr. 1, 2015

(86) PCT No.: PCT/CN2015/075673
§ 371 (c)(1),
(2) Date: Jun. 25, 2015

(87) PCT Pub. No.: WO2016/115775
PCT Pub. Date: Jul. 28, 2016

(65) Prior Publication Data
US 2016/0307977 A1    Oct. 20, 2016

(30) Foreign Application Priority Data
Jan. 21, 2015  (CN) .......................... 2015 1 0031419

(51) Int. Cl.
*H01L 29/08* (2006.01)
*H01L 27/32* (2006.01)
(Continued)

(52) U.S. Cl.
CPC ........ *H01L 27/3262* (2013.01); *H01L 27/322* (2013.01); *H01L 27/3248* (2013.01);
(Continued)

(58) Field of Classification Search
CPC .................................................. H01L 27/3262
(Continued)

(56) References Cited

U.S. PATENT DOCUMENTS

| 2004/0185300 A1 | 9/2004 | Hatwar et al. |
| 2006/0220008 A1* | 10/2006 | Ko .......... H01L 27/322 257/40 |

(Continued)

FOREIGN PATENT DOCUMENTS

| CN | 1729724 A | 2/2006 |
| CN | 104112766 A | 10/2014 |

*Primary Examiner* — Ajay K Arora
(74) *Attorney, Agent, or Firm* — Leong C. Lei

(57) ABSTRACT

The present invention provides an OLED color display device, comprising a substrate (1), an anode (11), a thin film transistor array (21), a Hole Injection Layer (22), a Hole Transport Layer (23), a light emitting layer (3), an Electron Transport Layer (24), a cathode (12), a package cover plate (2), a color conversion layer (4) and a seal frame (5); the light emitting layer (3) comprises a first light emitting layer (31) and the second light emitting layer (32), and both the first light emitting layer (31) and the second light emitting layer (32) are manufactured by host material doped with guest material, and the guest material comprises luminescent material and electron transport material; the first light emitting layer (31) is a blue light emitting layer, and the second light emitting layer (32) is a red, green lights commonly emitting layer, a yellow light emitting layer or a green light emitting layer; lights emitted by the first light emitting layer (31) and the second light emitting layer (32) synthesize white light or blue, green light possessing higher energy efficiency and luminescence efficiency. The power consumption is low.

19 Claims, 6 Drawing Sheets

(51) Int. Cl.
*H01L 51/52* (2006.01)
*H01L 27/12* (2006.01)
*H01L 51/00* (2006.01)
*H01L 51/50* (2006.01)

(52) U.S. Cl.
CPC ........ H01L 51/504 (2013.01); H01L 51/5024 (2013.01); H01L 51/524 (2013.01); *H01L 27/1214* (2013.01); *H01L 51/001* (2013.01); *H01L 51/0003* (2013.01); *H01L 51/007* (2013.01); *H01L 51/0035* (2013.01); *H01L 51/0061* (2013.01); *H01L 51/0067* (2013.01); *H01L 51/0072* (2013.01); *H01L 51/0073* (2013.01); *H01L 51/0085* (2013.01); *H01L 51/5012* (2013.01); *H01L 51/5016* (2013.01); *H01L 51/5056* (2013.01); *H01L 51/5072* (2013.01); *H01L 2051/0063* (2013.01); *H01L 2251/5338* (2013.01); *H01L 2251/5376* (2013.01)

(58) Field of Classification Search
USPC .......................................................... 257/40
See application file for complete search history.

(56) References Cited

U.S. PATENT DOCUMENTS

2010/0224859 A1* 9/2010 Gough .................. B82Y 20/00
257/13
2011/0073844 A1* 3/2011 Pieh .................... H01L 51/5036
257/40

* cited by examiner

OLED COLOR DISPLAY DEVICE

FIELD OF THE INVENTION

The present invention relates to a display technology field, and more particularly to an OLED color display device.

BACKGROUND OF THE INVENTION

Organic Light Emitting Diode (OLED) is a flat panel display technology which has great prospects for development. It does not only possess extremely excellent display performance but also properties of self-illumination, simple structure, ultra thin, fast response speed, wide view angle, low power consumption and capability of realizing flexible display, and therefore is considered as "dream display". Meanwhile, the investment for the production equipments is far smaller than the Liquid Crystal Display (LCD). It has been favored by respective big display makers and has become the main selection of the third generation display element.

An OLED generally comprises: a substrate, a Hole Injection Layer (HIL) located on the substrate, a Hole Transport Layer (HTL) located on the Hole Injection Layer, a light emitting layer (Emitter) located on the Hole Transport Layer, an Electron Transport Layer (ETL) located on the light emitting layer, an Electron Injection Layer (EIL) located on the Electron Transport Layer and a Cathode located on the Electron Injection Layer. For promoting the efficiency, the light emitting layer is generally applied with co-host system. At present, there are several technologies of realizing the OLED colorization: one is Red, Green, Blue (RGB), three primary colors luminescence, represented by Samsung Corp. This technology is only applied for organic small molecular material which is easily sublimated. The merit is that the process is simple, mature and easy for operation. However, the high accuracy mask and the precise alignment are required as manufacturing the high resolution display panel, the production is inevitably lower and the manufacture cost is higher, accordingly. Besides, the differences of the lifetimes, the excitation rates and the decays of the three primary colors are large, which can likely result in the color cast of the OLED color display device.

Another is white light+RGB color filters (CF) technology, represented by LG Corp. The mature CF technology of the LCD can be utilized. No mask alignment is required, which tremendously simplifies the evaporation process to cut down the manufacture cost and to be applicable for manufacturing large scale high resolution OLED.

Nevertheless, in the white light+RGB color filters technology, the light emitting layer is not doped with electron transport material to make the light emitting position away from the interface of the light emitting layer and the Electron Transport layer. As a result, the energy efficiency is lower and the power consumption is higher.

Therefore, there is a need to develop an OLED display device, possessing higher energy efficiency and low power consumption.

SUMMARY OF THE INVENTION

An objective of the present invention is to provide an OLED display device, possessing higher energy efficiency and luminescence efficiency. The power consumption is low.

For realizing the aforesaid objective, the present invention provides an OLED color display device, comprising a substrate, an anode formed on the substrate, a thin film transistor array formed on the anode, a Hole Injection Layer formed on the thin film transistor array, a Hole Transport Layer formed on the Hole Injection Layer, a light emitting layer formed on the Hole Transport Layer, an Electron Transport Layer formed on the light emitting layer, a cathode formed on the Electron Transport Layer, a package cover plate formed on the cathode and laminated with the substrate, a color conversion layer formed at an inner side of the package cover plate and a seal frame adhering the substrate and the package cover plate;

the light emitting layer comprises a first light emitting layer and a second light emitting layer, and both the first light emitting layer and the second light emitting layer are manufactured by host material doped with guest material, and the guest material comprises luminescent material and electron transport material; the first light emitting layer is a blue light emitting layer, and the second light emitting layer is a red, green lights commonly emitting layer, a yellow light emitting layer or a green light emitting layer; lights emitted by the first light emitting layer and the second light emitting layer synthesize white light or blue, green light;

the color conversion layer comprises a blue light filter unit, a green light filter unit and a red light conversion unit which are located in intervals; the white light or the blue, green light is filtered by the blue light filter unit to be blue light, and is filtered by the green light filter unit to be green light, and is converted by the red light conversion unit to be red light to achieve color display.

A ratio of the host material and the guest material is 8:1-20:1, and a ratio of the luminescent material and the electron transport material in the guest material is 1:1-10:1.

The color conversion layer further comprises a blank transmission unit, and the white light or the blue, green light remains to be the white light or the blue, green light after penetrating the blank transmission unit.

In the first light emitting layer, the host material is organic blue light host material, and the luminescent material and the electron transport material in the guest material respectively are blue fluorescence dopant and electron transport dopant; in the second light emitting layer, the host material is organic blue light host material or organic green light host material, and the luminescent material and the electron transport material in the guest material respectively are phosphorescence dopant and electron transport dopant.

The phosphorescence dopant is red, green phosphorescence co dopant or yellow phosphorescence dopant to synthesize the blue fluorescence emitted by the first light emitting layer and the red, green phosphorescence or the yellow phosphorescence emitted by the second light emitting layer to be white light; or the phosphorescence dopant is green phosphorescence to synthesize the blue fluorescence emitted by the first light emitting layer and the green phosphorescence emitted by the second light emitting layer to be blue, green light.

The light emitting layer further comprises a separation layer between the first light emitting layer and the second light emitting layer, and the separation layer is constituted by the host material doped with the electron transport material, and the host material is organic blue light host material or organic green light host material.

Material of the substrate and the package cover plate is glass or flexible material, and at least one of the substrate and the package cover plate is transparent.

The blue light host material is 4,4',4"-Tris(carbazol-9-yl)-triphenylamine or 2,4,6-Tri(9H-carbazol-9-yl)-1,3,5-triazine; the green light host material is 3,3'-(1,3 phenyl)Bis(7-

Ethoxy-4-methylcoumarin); the blue fluorescence dopant is polyfluorene, 4,4'-Bis(2,2-diphenylvinyl)biphenyl or FIr6; the red, green phosphorescence co dopant comprises red phosphorescence dopant and green phosphorescence dopant; the red phosphorescence dopant is Tris[1-phenylisoquinolinato-C2,N]iridium(III); the green phosphorescence dopant is Tris(2-phenylpyridine)iridium; the yellow phosphorescence dopant is Bis(2,3-diphenylpyrazine)-(Acetylacetonato)iridium; the Electron Transport dopant is 2-(4-tert-Butylphenyl)-5-(4-biphenyl)-1,3,4-oxadiazole.

The light emitting layer is formed by thermal evaporation or solution film formation.

Material of the Electron Transport Layer is 8-Hydroxyquinoline aluminum salt and material of the Hole Transport Layer is poly-TPD.

The present invention further provides an OLED color display device, comprising a substrate, an anode formed on the substrate, a thin film transistor array formed on the anode, a Hole Injection Layer formed on the thin film transistor array, a Hole Transport Layer formed on the Hole Injection Layer, a light emitting layer formed on the Hole Transport Layer, an Electron Transport Layer formed on the light emitting layer, a cathode formed on the Electron Transport Layer, a package cover plate formed on the cathode and laminated with the substrate, a color conversion layer formed at an inner side of the package cover plate and a seal frame adhering the substrate and the package cover plate;

the light emitting layer comprises a first light emitting layer and a second light emitting layer, and both the first light emitting layer and the second light emitting layer are manufactured by host material doped with guest material, and the guest material comprises luminescent material and electron transport material; the first light emitting layer is a blue light emitting layer, and the second light emitting layer is a red, green lights commonly emitting layer, a yellow light emitting layer or a green light emitting layer; lights emitted by the first light emitting layer and the second light emitting layer synthesize white light or blue, green light;

the color conversion layer comprises a blue light filter unit, a green light filter unit and a red light conversion unit which are located in intervals; the white light or the blue, green light is filtered by the blue light filter unit to be blue light, and is filtered by the green light filter unit to be green light, and is converted by the red light conversion unit to be red light to achieve color display;

a ratio of the host material and the guest material is 8:1-20:1, and a ratio of the luminescent material and the electron transport material in the guest material is 1:1-10:1;

the color conversion layer further comprises a blank transmission unit, and the white light or the blue, green light remains to be the white light or the blue, green light after penetrating the blank transmission unit;

the light emitting layer further comprises a separation layer between the first light emitting layer and the second light emitting layer, and the separation layer is constituted by the host material doped with the electron transport material, and the host material is organic blue light host material or organic green light host material;

wherein material of the substrate and the package cover plate is glass or flexible material, and at least one of the substrate and the package cover plate is transparent;

wherein the light emitting layer is formed by thermal evaporation or solution film formation;

wherein material of the Electron Transport Layer is 8-Hydroxyquinoline aluminum salt and material of the Hole Transport Layer is poly-TPD.

The benefits of the present invention are: the present invention provides an OLED color display device, and the light emitting layer thereof comprises a first light emitting layer and a second light emitting layer, of which the blue light luminescent material and the red light luminescent material that the energy band gaps are large, the yellow light luminescent material or the green light luminescent material are respectively located in the first, the second light emitting layers to realize the layers luminescence and synthesize white light or blue, green light with higher energy efficiency. Meanwhile, the electron transport material is respectively doped into the first, the second light emitting layers to assist the Electron Transport, and meanwhile to make the light emitting position away from the interface of the light emitting layer and the Electron Transport layer for preventing the exciton annihilation. The luminescence efficiency of the OLED color display device is effectively promoted and the power consumption is reduced.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
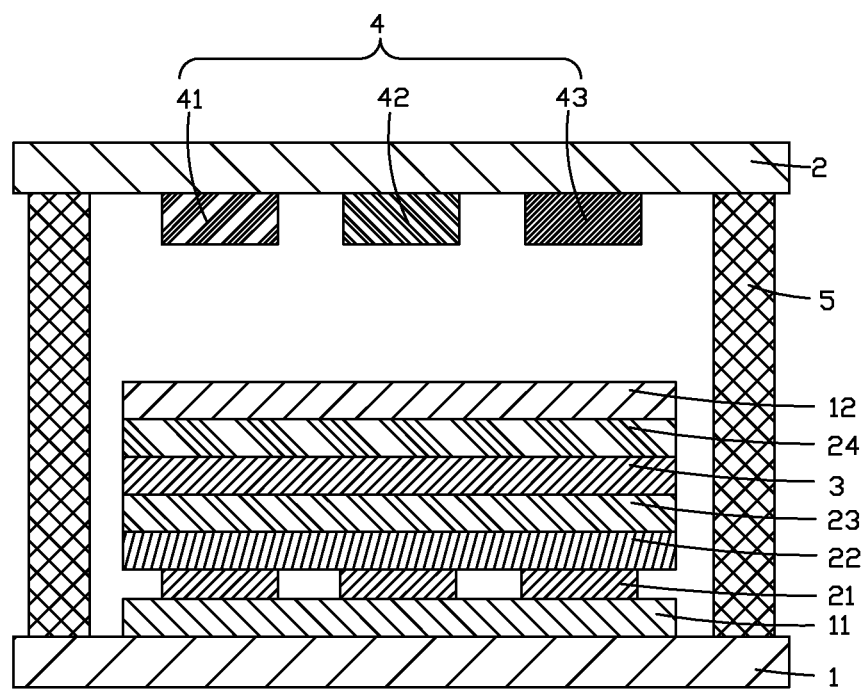
FIG. 1 is a structural diagram of an OLED color display device according to the first embodiment of the present invention.

Please refer to FIG. 1, which is a structural diagram of an OLED color display device according to the first embodiment of the present invention. The device comprises a substrate 1, an anode 11 formed on the substrate 1, a thin film transistor (TFT) array 21 formed on the anode 11, a Hole Injection Layer 22 formed on the thin film transistor array 21, a Hole Transport Layer 23 formed on the Hole Injection Layer 22, a light emitting layer 3 formed on the Hole Transport Layer 23, an Electron Transport Layer 24 formed on the light emitting layer 3, a cathode 12 formed on the Electron Transport Layer 24, a package cover plate 2 formed on the cathode 12 and laminated with the substrate 1, a color conversion layer 4 formed at an inner side of the package cover plate 2 and a seal frame 5 adhering the substrate 1 and the package cover plate 2.

Figure 2:
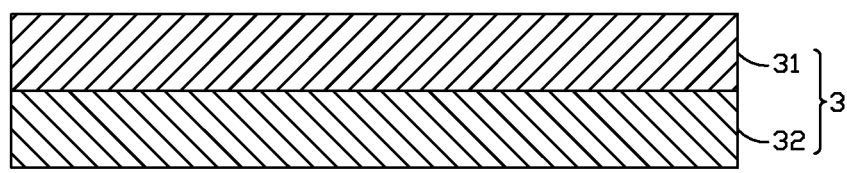
FIG. 2 is a first structure diagram of a light emitting layer in the OLED color display device according to the present invention.

Please refer to FIG. 2. The light emitting layer 3 comprises a first light emitting layer 31 and a second light emitting layer 32. The first light emitting layer 31 is a blue light emitting layer, and the second light emitting layer 32 is a red, green lights commonly emitting layer, a yellow light emitting layer or a green light emitting layer. Lights emitted by the first light emitting layer 31 and the second light emitting layer 32 synthesize white light or blue, green light.

The color conversion layer 4 comprises a blue light filter unit 41, a green light filter unit 42 and a red light conversion unit 43 which are located in intervals. The blue light filter unit 41 and the green light filter unit 42 utilize Color Filters (CF) theory to perform light filter to obtain blue light and green light. The red light conversion unit 43 utilizes Color Change Material (CCM) to perform the light color conversion. The white light or the blue, green light is filtered by the blue light filter unit 41 to be blue light, and is filtered by the green light filter unit 42 to be green light, and is converted by the red light conversion unit 43 to be red light to achieve color display.

Specifically, material of the substrate 1 and the package cover plate 2 can be glass or flexible material. At least one of them has to be transparent. Preferably, both the substrate 1 and the package cover plate 2 are glass plates. The seal frame 5 can prevent the entrance of the external water vapor, oxygen to protect the internal elements.

Material of the Hole Transport Layer 23 is poly-TPD and material of the Electron Transport Layer 24 is 8-Hydroxyquinoline aluminum salt (Alq3).

Both the first light emitting layer 31 and the second light emitting layer 32 are manufactured by host material doped with guest material, and the guest material comprises luminescent material and electron transport material. The electron transport material can function to increase the electron transport speed.

Preferably, a ratio of the host material and the guest material is 8:1-20:1, and a ratio of the luminescent material and the electron transport material in the guest material is 1:1-10:1.

In the first light emitting layer 31, the host material is organic blue light host material, and the luminescent material and the electron transport material in the guest material respectively are blue fluorescence dopant and electron transport dopant. In the second light emitting layer 32, the host material is organic blue light host material or organic green light host material, and the luminescent material and the electron transport material in the guest material respectively are phosphorescence dopant and electron transport dopant.

The phosphorescence dopant can be red, green phosphorescence co dopant or yellow phosphorescence dopant to synthesize the blue fluorescence emitted by the first light emitting layer 31 and the red, green phosphorescence or the yellow phosphorescence emitted by the second light emitting layer 32 to be white light. Or, the phosphorescence dopant can be green phosphorescence to synthesize the blue fluorescence emitted by the first light emitting layer 31 and the green phosphorescence emitted by the second light emitting layer 32 to be blue, green light.

Figure 3:
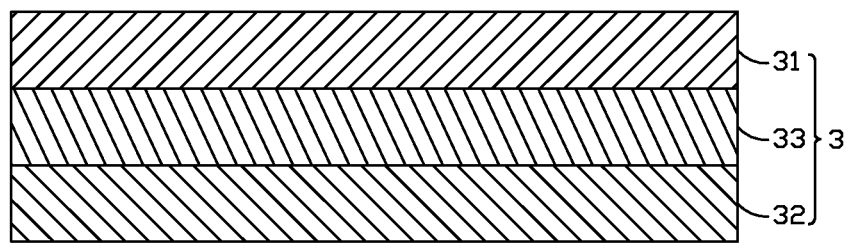
FIG. 3 is a second structure diagram of a light emitting layer in the OLED color display device according to the present invention.

Except the first light emitting layer 31 and the second light emitting layer 32 shown in FIG. 3, the light emitting layer 3 can further comprises a separation layer 33 between the first light emitting layer 31 and the second light emitting layer 32. The separation layer 33 is constituted by the host material doped with the electron transport material, and the host material can be organic blue light host material or organic green light host material. The function of the separation layer 33 is to separate the first light emitting layer 31 and the second light emitting layer 32 to make the excitons in the first light emitting layer 31 with the blue fluorescence dopant and the excitons in the second light emitting layer 32 with the phosphorescence dopant not interfere with each other.

Furthermore, the blue light host material can be 4,4',4"-Tris(carbazol-9-yl)-triphenylamine (TCTA), which the molecular formula is:

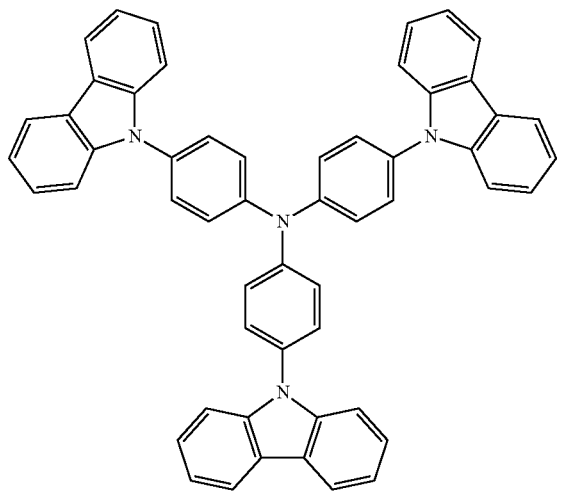 [SMILES: c1ccc2c(c1)c1ccccc1n2-c1ccc(N(c2ccc(-n3c4ccccc4c4ccccc43)cc2)c2ccc(-n3c4ccccc4c4ccccc43)cc2)cc1]

or 2,4,6-Tri(9H-carbazol-9-yl)-1,3,5-triazine (TRZ), which the molecular formula is:

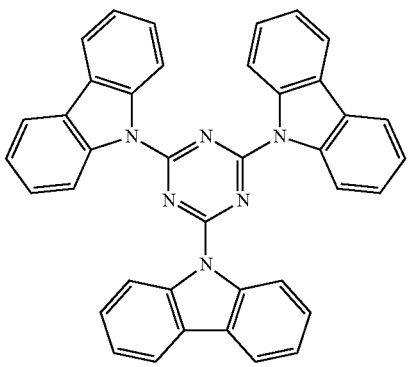 [SMILES: c1ccc2c(c1)c1ccccc1n2-c1nc(-n2c3ccccc3c3ccccc32)nc(-n2c3ccccc3c3ccccc32)n1]

The green light host material can be 3,3'-(1,3 phenyl)Bis (7-Ethoxy-4-methylcoumarin) (mEMCB), which the molecular formula is:

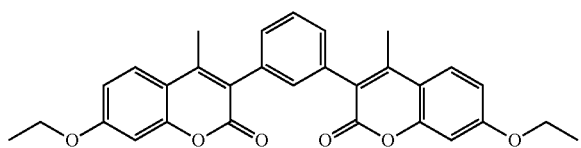 [SMILES: CCOc1ccc2c(C)c(-c3cccc(-c4c(C)c5ccc(OCC)cc5oc4=O)c3)c(=O)oc2c1]

The blue fluorescence dopant can be polyfluorene, 4,4'-Bis(2,2-diphenylvinyl)biphenyl (DPVBi) or FIr6.

The red, green phosphorescence co dopant comprises red phosphorescence dopant and green phosphorescence dopant. The red phosphorescence dopant can be Tris[1-phenylisoquinolinato-C2,N]iridium(III) (Ir(piq)3), which the molecular formula is:

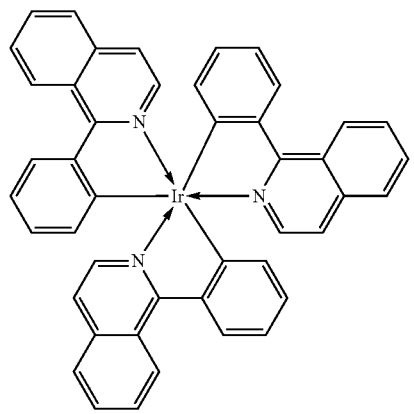

The green phosphorescence dopant can be Tris(2-phenylpyridine)iridium (Ir(ppy)3), which the molecular formula is:

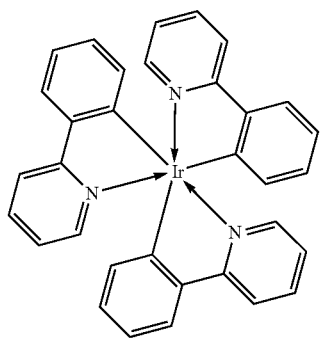

The yellow phosphorescence dopant can be Bis(2,3-diphenylpyrazine)-(Acetylacetonato)iridium (Ir(dphp)2(acac)), which the molecular formula is:

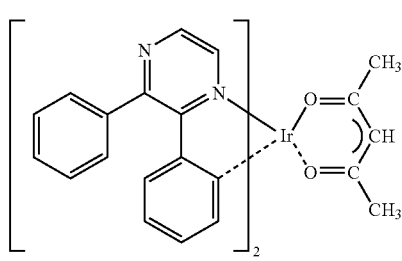

The Electron Transport dopant can be 2-(4-tert-Butylphenyl)-5-(4-biphenyl)-1,3,4-oxadiazole (PBD), which the molecular formula is:

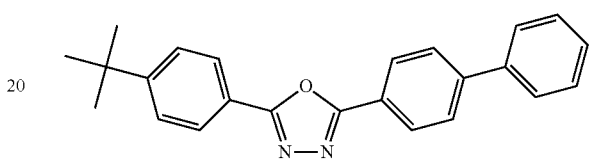

The light emitting layer 3 can be formed by thermal evaporation or solution film formation.

The light emitting layer 3 is arranged to be a first light emitting layer 31 and a second light emitting layer 32, of which the blue light luminescent material and the red light luminescent material that the energy band gaps are large, the yellow light luminescent material or the green light luminescent material are respectively located in the first, the second light emitting layers 31, 32 to realize the layers luminescence and synthesize white light or blue, green light with higher energy efficiency. Meanwhile, the electron transport material is respectively doped into the first, the second light emitting layers 31, 32 to assist the Electron Transport, and meanwhile to make the light emitting position away from the interface of the light emitting layer 3 and the Electron Transport layer 24 for preventing the exciton annihilation. The luminescence efficiency of the OLED color display device is effectively promoted and the power consumption is reduced.

Figure 4:
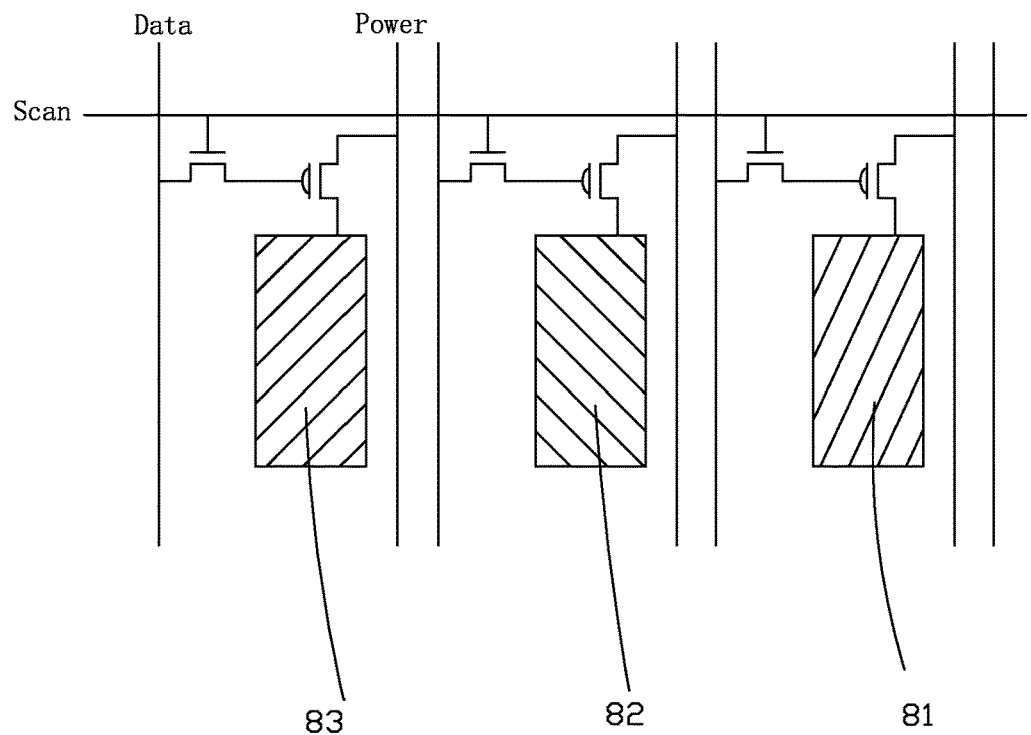
FIG. 4 is a drive circuit diagram of one pixel in FIG. 1.

Please refer to FIG. 4. In the first embodiment, the blue light filter unit 41, the green light filter unit 42 and the red light conversion unit 43 correspond to one pixel. The pixel comprises a red sub pixel 83, a green sub pixel 82 and a blue sub pixel 81. The red light conversion unit 43 corresponds to the red sub pixel 83, and the green light filter unit 42 corresponds to the green sub pixel 82, and the blue light filter unit 41 corresponds to the blue sub pixel 81. The red sub pixel 83, the green sub pixel 82 and the blue sub pixel 81 respectively correspond to one TFT to control whether the region of the light emitting layer 3 corresponding to each sub pixel emits light or not.

When the TFT controls the region of the light emitting layer 3 corresponding to the blue sub pixel 81 to emit light, the white light or blue, green light emitted by the light emitting layer 3 is filtered by the blue light filter unit 41 to be blue light; when the TFT controls the region of the light emitting layer 3 corresponding to the green sub pixel 82 to emit light, the white light or blue, green light emitted by the light emitting layer 3 is filtered by the green light filter unit 42 to be green light; when the TFT controls the region of the light emitting layer 3 corresponding to the green sub pixel 83 to emit light, the white light or blue, green light emitted by the light emitting layer 3 is converted by the red light conversion unit 43 to be red light. Thus, the display of the red, green, blue, the three primary colors are achieved, and by overlapping them, kinds of colors can be derived to realize color display.

Figure 5:
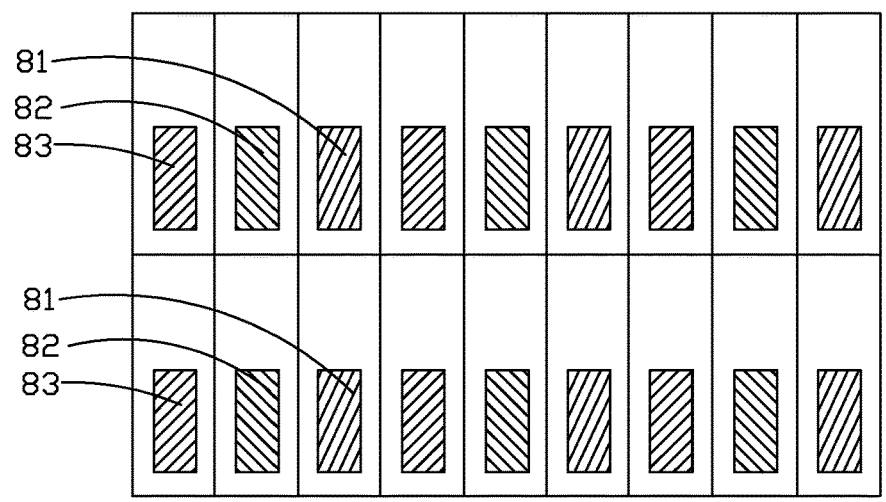
FIG. 5 is a pixel arrangement diagram of the OLED color display device according to the first embodiment of the present invention.

Please refer to FIG. 5, which is a pixel arrangement diagram of the OLED color display device according to the first embodiment of the present invention. The pixel arrangements of every two adjacent upper and lower rows are exactly the same. The red sub pixel 83, the green sub pixel 82 and the blue sub pixel 81 are sequentially arranged in intervals from left to right along the horizontal direction.

Figure 6:
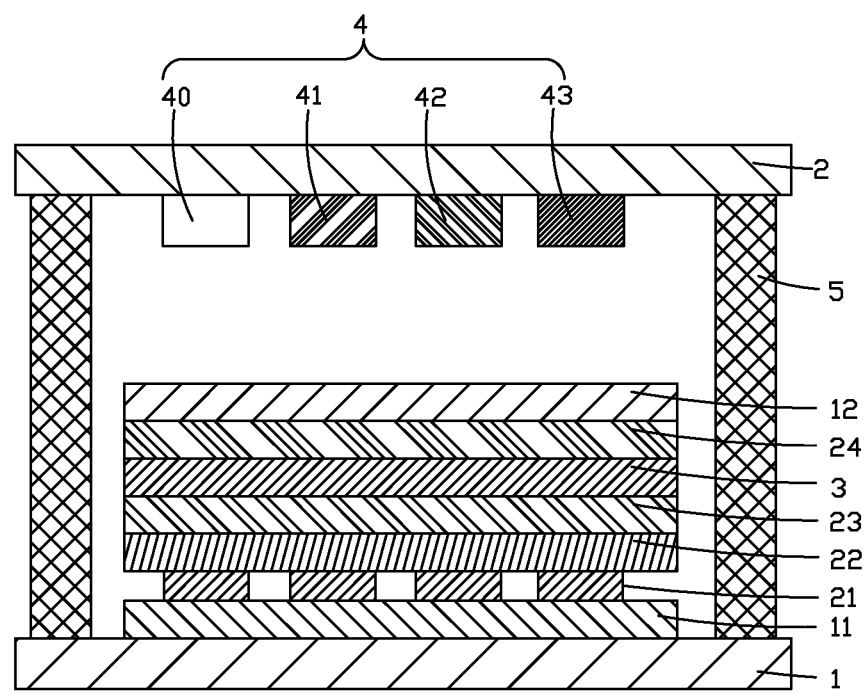
FIG. 6 is a structural diagram of an OLED color display device according to the second embodiment of the present invention.

Please refer to FIG. 6, which is a structural diagram of an OLED color display device according to the second embodiment of the present invention. The difference of the second embodiment from the aforesaid first embodiment is that the color conversion layer 4 further comprises a blank transmission unit 40, and the white light or the blue, green light remains to be the white light or the blue, green light after penetrating the blank transmission unit 40, which is capable of increasing the brightness of the OLED color display device.

Figure 7:
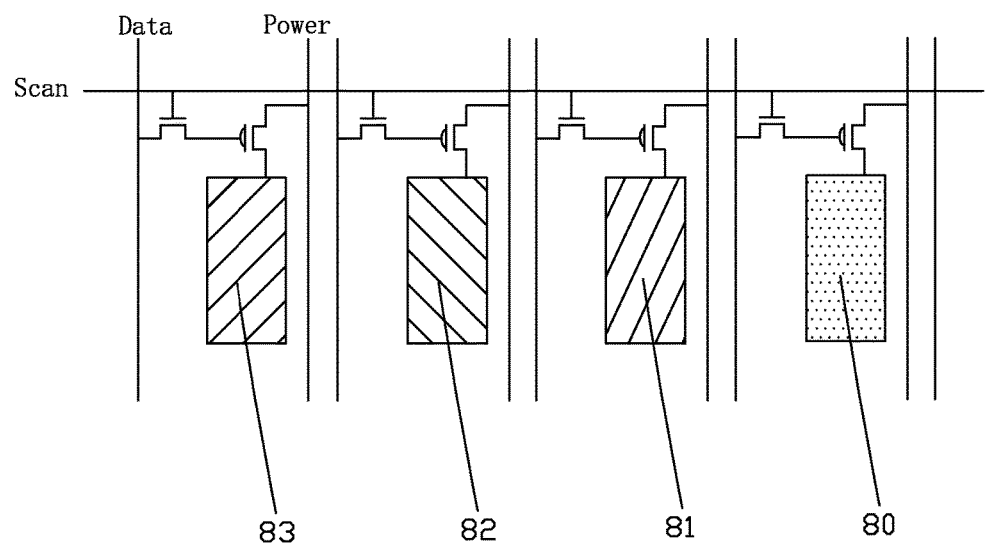
FIG. 7 is a drive circuit diagram of one pixel in FIG. 6.

Please refer to FIG. 7. In the second embodiment, the blue light filter unit 41, the green light filter unit 42, the red light conversion unit 43 and the blank transmission unit 40 correspond to one pixel. The pixel comprises a red sub pixel 83, a green sub pixel 82, a blue sub pixel 81 and a white or blue, green sub pixel 80. The red light conversion unit 43 corresponds to the red sub pixel 83, and the green light filter unit 42 corresponds to the green sub pixel 82, and the blue light filter unit 41 corresponds to the blue sub pixel 81, and the blank transmission unit 40 corresponds to the white or blue, green sub pixel 80. The red sub pixel 83, the green sub pixel 82, the blue sub pixel 81 and the white or blue, green sub pixel 80 respectively correspond to one TFT to control whether the region corresponding to the light emitting layer 3 of each sub pixel emits light or not.

Figure 8:
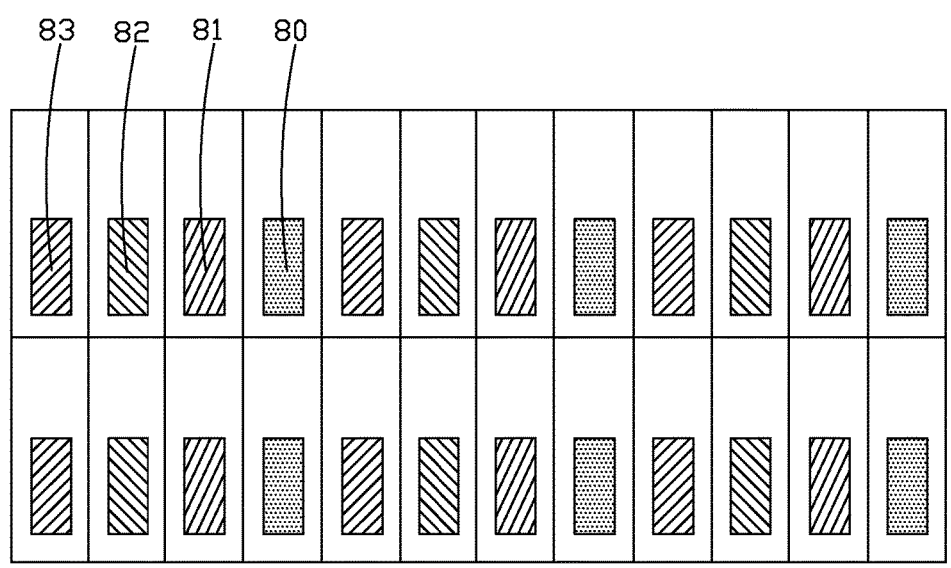
FIG. 8 is one pixel arrangement diagram of the OLED color display device according to the second embodiment of the present invention.

Please refer to FIG. 8, which is a pixel arrangement diagram of the OLED color display device according to the second embodiment of the present invention. The pixel arrangements of every two adjacent upper and lower rows are exactly the same. The red sub pixel 83, the green sub pixel 82, the blue sub pixel 81 and the white or blue, green sub pixel 80 are sequentially arranged in intervals from left to right along the horizontal direction.

Figure 9:
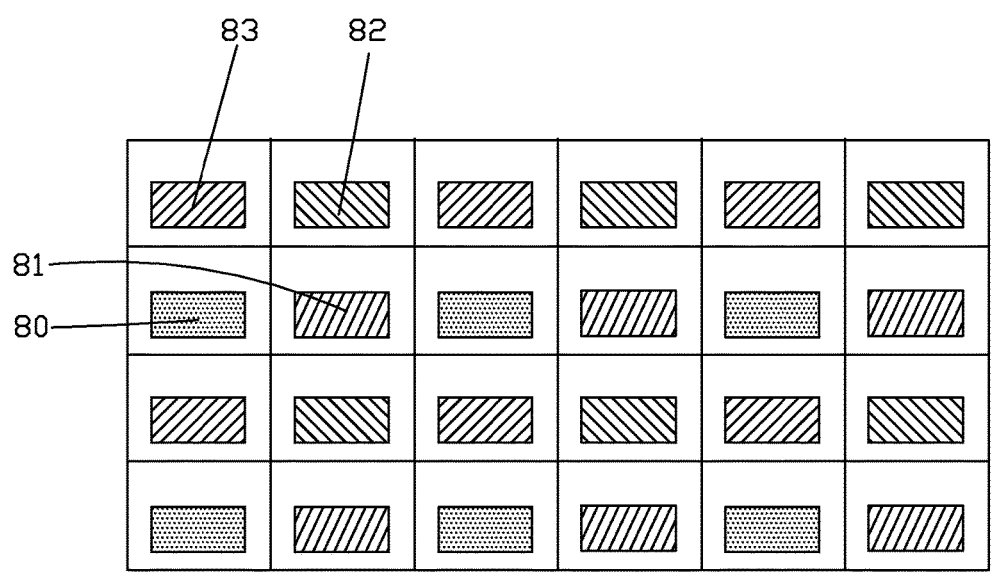
FIG. 9 is another pixel arrangement diagram of the color display device according to the second embodiment of the present invention.

Please refer to FIG. 9, which is another pixel arrangement diagram of the color display device according to the second embodiment of the present invention. The red sub pixel 83, the green sub pixel 82, the blue sub pixel 81 and the white or blue, green sub pixel 80 are sequentially arranged in intervals along with the clockwise direction. It is concluded that the technical effect of the present invention can be irrelevant with the arrangement of the respective sub pixels of the pixel and can be applied to the OLED color display devices of different pixel arrangements.

In conclusion, the present invention provides an OLED color display device, and the light emitting layer thereof comprises a first light emitting layer and a second light emitting layer, of which the blue light luminescent material and the red light luminescent material that the energy band gaps are large, the yellow light luminescent material or the green light luminescent material are respectively located in the first, the second light emitting layers to realize the layers luminescence and synthesize white light or blue, green light with higher energy efficiency. Meanwhile, the electron transport material is respectively doped into the first, the second light emitting layers to assist the Electron Transport, and meanwhile to make the light emitting position away from the interface of the light emitting layer and the Electron Transport layer for preventing the exciton annihilation. The luminescence efficiency of the OLED color display device is effectively promoted and the power consumption is reduced.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. An OLED color display device, comprising a substrate, an anode formed on the substrate, a thin film transistor array formed on the anode, a Hole Injection Layer formed on the thin film transistor array, a Hole Transport Layer formed on the Hole Injection Layer, a light emitting layer formed on the Hole Transport Layer, an Electron Transport Layer formed on the light emitting layer, a cathode formed on the Electron Transport Layer, a package cover plate formed on the cathode and laminated with the substrate, a color conversion layer formed at an inner side of the package cover plate and a seal frame adhering the substrate and the package cover plate;

wherein the light emitting layer comprises a first light emitting layer and a second light emitting layer, and both the first light emitting layer and the second light emitting layer are manufactured by host material doped with guest material, and the guest material comprises luminescent material and electron transport material; the first light emitting layer is a blue light emitting layer, and the second light emitting layer is a red, green lights commonly emitting layer, a yellow light emitting layer or a green light emitting layer; lights emitted by the first light emitting layer and the second light emitting layer synthesize white light or blue, green light;

wherein the color conversion layer comprises a blue light filter unit, a green light filter unit and a red light conversion unit which are located in intervals; the white light or the blue, green light is filtered by the blue light filter unit to be blue light, and is filtered by the green light filter unit to be green light, and is converted by the red light conversion unit to be red light to achieve color display; and wherein a ratio of the host material and the guest material is 8:1-20:1, and a ratio of the luminescent material and the electron transport material in the guest material is 1:1-10:1.

2. The OLED color display device according to claim 1, wherein the color conversion layer further comprises a blank transmission unit, and the white light or the blue, green light remains to be the white light or the blue, green light after penetrating the blank transmission unit.

3. The OLED color display device according to claim 1, wherein in the first light emitting layer, the host material is organic blue light host material, and the luminescent material and the electron transport material in the guest material respectively are blue fluorescence dopant and electron transport dopant; in the second light emitting layer, the host material is organic blue light host material or organic green light host material, and the luminescent material and the electron transport material in the guest material respectively are phosphorescence dopant and electron transport dopant.

4. The OLED color display device according to claim 3, wherein the phosphorescence dopant is red, green phosphorescence co dopant or yellow phosphorescence dopant to synthesize the blue fluorescence emitted by the first light emitting layer and the red, green phosphorescence or the yellow phosphorescence emitted by the second light emitting layer to be white light; or the phosphorescence dopant is green phosphorescence to synthesize the blue fluorescence emitted by the first light emitting layer and the green phosphorescence emitted by the second light emitting layer to be blue, green light.

5. The OLED color display device according to claim 1, wherein the light emitting layer further comprises a separation layer between the first light emitting layer and the second light emitting layer, and the separation layer is constituted by the host material doped with the electron transport material, and the host material is organic blue light host material or organic green light host material.

6. The OLED color display device according to claim 1, wherein material of the substrate and the package cover plate is glass or flexible material, and at least one of the substrate and the package cover plate is transparent.

7. The OLED color display device according to claim 4, wherein the blue light host material is 4,4',4''-Tris(carbazol-9-yl)-triphenylamine or 2,4,6-Tri(9H-carbazol-9-yl)-1,3,5-triazine; the green light host material is 3,3'-(1,3 phenyl)Bis(7-Ethoxy-4-methylcoumarin); the blue fluorescence dopant is polyfluorene, 4,4'-Bis(2,2-diphenylvinyl)biphenyl or FIr6; the red, green phosphorescence co dopant comprises red phosphorescence dopant and green phosphorescence dopant; the red phosphorescence dopant is Tris[1-phenylisoquinolinato-C2,N]iridium(III); the green phosphorescence dopant is Tris(2-phenylpyridine)iridium; the yellow phosphorescence dopant is Bis(2,3-diphenylpyrazine)-(Acetylacetonato)iridium; the Electron Transport dopant is 2-(4-tert-Butylphenyl)-5-(4-biphenyl)-1,3,4-oxadiazole.

8. The OLED color display device according to claim 1, wherein the light emitting layer is formed by thermal evaporation or solution film formation.

9. The OLED color display device according to claim 1, wherein material of the Electron Transport Layer is 8-Hydroxyquinoline aluminum salt and material of the Hole Transport Layer is poly-TPD.

10. An OLED color display device, comprising a substrate, an anode formed on the substrate, a thin film transistor array formed on the anode, a Hole Injection Layer formed on the thin film transistor array, a Hole Transport Layer formed on the Hole Injection Layer, a light emitting layer formed on the Hole Transport Layer, an Electron Transport Layer formed on the light emitting layer, a cathode formed on the Electron Transport Layer, a package cover plate formed on the cathode and laminated with the substrate, a color conversion layer formed at an inner side of the package cover plate and a seal frame adhering the substrate and the package cover plate;
the light emitting layer comprises a first light emitting layer and a second light emitting layer, and both the first light emitting layer and the second light emitting layer are manufactured by host material doped with guest material, and the guest material comprises luminescent material and electron transport material; the first light emitting layer is a blue light emitting layer, and the second light emitting layer is a red, green lights commonly emitting layer, a yellow light emitting layer or a green light emitting layer; lights emitted by the first light emitting layer and the second light emitting layer synthesize white light or blue, green light;
the color conversion layer comprises a blue light filter unit, a green light filter unit and a red light conversion unit which are located in intervals; the white light or the blue, green light is filtered by the blue light filter unit to be blue light, and is filtered by the green light filter unit to be green light, and is converted by the red light conversion unit to be red light to achieve color display;
a ratio of the host material and the guest material is 8:1-20:1, and a ratio of the luminescent material and the electron transport material in the guest material is 1:1-10:1;
the color conversion layer further comprises a blank transmission unit, and the white light or the blue, green light remains to be the white light or the blue, green light after penetrating the blank transmission unit;
the light emitting layer further comprises a separation layer between the first light emitting layer and the second light emitting layer, and the separation layer is constituted by the host material doped with the electron transport material, and the host material is organic blue light host material or organic green light host material;
wherein material of the substrate and the package cover plate is glass or flexible material, and at least one of the substrate and the package cover plate is transparent;
wherein the light emitting layer is formed by thermal evaporation or solution film formation;
wherein material of the Electron Transport Layer is 8-Hydroxyquinoline aluminum salt and material of the Hole Transport Layer is poly-TPD.

11. The OLED color display device according to claim 10, wherein in the first light emitting layer, the host material is organic blue light host material, and the luminescent material and the electron transport material in the guest material respectively are blue fluorescence dopant and electron transport dopant; in the second light emitting layer, the host material is organic blue light host material or organic green light host material, and the luminescent material and the electron transport material in the guest material respectively are phosphorescence dopant and electron transport dopant.

12. The OLED color display device according to claim 11, wherein the phosphorescence dopant is red, green phosphorescence co dopant or yellow phosphorescence dopant to synthesize the blue fluorescence emitted by the first light emitting layer and the red, green phosphorescence or the yellow phosphorescence emitted by the second light emitting layer to be white light; or the phosphorescence dopant is green phosphorescence to synthesize the blue fluorescence emitted by the first light emitting layer and the green phosphorescence emitted by the second light emitting layer to be blue, green light.

13. The OLED color display device according to claim 12, wherein the blue light host material is 4,4',4''-Tris(carbazol-9-yl)-triphenylamine or 2,4,6-Tri(9H-carbazol-9-yl)-1,3,5-triazine; the green light host material is 3,3'-(1,3 phenyl)Bis(7-Ethoxy-4-methylcoumarin); the blue fluorescence dopant is polyfluorene, 4,4'-Bis(2,2-diphenylvinyl)biphenyl or FIr6; the red, green phosphorescence co dopant comprises red phosphorescence dopant and green phosphorescence dopant; the red phosphorescence dopant is Tris[1-phenylisoquinolinato-C2,N]iridium(III); the green phosphorescence dopant is Tris(2-phenylpyridine)iridium; the yellow phosphorescence dopant is Bis(2,3-diphenylpyrazine)-(Acetylacetonato)iridium; the Electron Transport dopant is 2-(4-tert-Butylphenyl)-5-(4-biphenyl)-1,3,4-oxadiazole.

14. An OLED color display device, comprising a substrate, an anode formed on the substrate, a thin film transistor array formed on the anode, a Hole Injection Layer formed on the thin film transistor array, a Hole Transport Layer formed on the Hole Injection Layer, a light emitting layer formed on the Hole Transport Layer, an Electron Transport Layer formed on the light emitting layer, a cathode formed on the Electron Transport Layer, a package cover plate formed on the cathode and laminated with the substrate, a color conversion layer formed at an inner side of the package cover plate and a seal frame adhering the substrate and the package cover plate;

wherein the light emitting layer comprises a first light emitting layer and a second light emitting layer, and both the first light emitting layer and the second light emitting layer are manufactured by host material doped with guest material, and the guest material comprises luminescent material and electron transport material; the first light emitting layer is a blue light emitting layer, and the second light emitting layer is a red, green lights commonly emitting layer, a yellow light emitting layer or a green light emitting layer; lights emitted by the first light emitting layer and the second light emitting layer synthesize white light or blue, green light;

wherein the color conversion layer comprises a blue light filter unit, a green light filter unit and a red light conversion unit which are located in intervals; the white light or the blue, green light is filtered by the blue light filter unit to be blue light, and is filtered by the green light filter unit to be green light, and is converted by the red light conversion unit to be red light to achieve color display; and wherein the color conversion layer further comprises a blank transmission unit, and the white light or the blue, green light remains to be the white light or the blue, green light after penetrating the blank transmission unit.

15. The OLED color display device according to claim 14, wherein a ratio of the host material and the guest material is 8:1-20:1, and a ratio of the luminescent material and the electron transport material in the guest material is 1:1-10:1.

16. The OLED color display device according to claim 15, wherein in the first light emitting layer, the host material is organic blue light host material, and the luminescent material and the electron transport material in the guest material respectively are blue fluorescence dopant and electron transport dopant; in the second light emitting layer, the host material is organic blue light host material or organic green light host material, and the luminescent material and the electron transport material in the guest material respectively are phosphorescence dopant and electron transport dopant.

17. An OLED color display device, comprising a substrate, an anode formed on the substrate, a thin film transistor array formed on the anode, a Hole Injection Layer formed on the thin film transistor array, a Hole Transport Layer formed on the Hole Injection Layer, a light emitting layer formed on the Hole Transport Layer, an Electron Transport Layer formed on the light emitting layer, a cathode formed on the Electron Transport Layer, a package cover plate formed on the cathode and laminated with the substrate, a color conversion layer formed at an inner side of the package cover plate and a seal frame adhering the substrate and the package cover plate;

wherein the light emitting layer comprises a first light emitting layer and a second light emitting layer, and both the first light emitting layer and the second light emitting layer are manufactured by host material doped with guest material, and the guest material comprises luminescent material and electron transport material; the first light emitting layer is a blue light emitting layer, and the second light emitting layer is a red, green lights commonly emitting layer, a yellow light emitting layer or a green light emitting layer; lights emitted by the first light emitting layer and the second light emitting layer synthesize white light or blue, green light;

wherein the color conversion layer comprises a blue light filter unit, a green light filter unit and a red light conversion unit which are located in intervals; the white light or the blue, green light is filtered by the blue light filter unit to be blue light, and is filtered by the green light filter unit to be green light, and is converted by the red light conversion unit to be red light to achieve color display; and wherein the light emitting layer further comprises a separation layer between the first light emitting layer and the second light emitting layer, and the separation layer is constituted by the host material doped with the electron transport material, and the host material is organic blue light host material or organic green light host material.

18. The OLED color display device according to claim 17, wherein a ratio of the host material and the guest material is 8:1-20:1, and a ratio of the luminescent material and the electron transport material in the guest material is 1:1-10:1.

19. The OLED color display device according to claim 18, wherein in the first light emitting layer, the host material is organic blue light host material, and the luminescent material and the electron transport material in the guest material respectively are blue fluorescence dopant and electron transport dopant; in the second light emitting layer, the host material is organic blue light host material or organic green light host material, and the luminescent material and the electron transport material in the guest material respectively are phosphorescence dopant and electron transport dopant.

* * * * *